(12) United States Patent
Nakajima et al.

(10) Patent No.: US 7,084,023 B2
(45) Date of Patent: Aug. 1, 2006

(54) METHOD OF MANUFACTURING SEMICONDUCTOR DEVICE, FILM-FORMING APPARATUS, AND STORAGE MEDIUM

(75) Inventors: Shigeru Nakajima, Tokyo-To (JP); Dong-Kyun Choi, Tokyo-To (JP); Tomonori Fujiwara, Tokyo-To (JP); Hiroaki Ikegawa, Tokyo-To (JP); Genji Nakamura, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/976,320

(22) Filed: Oct. 29, 2004

(65) Prior Publication Data

US 2005/0142716 A1 Jun. 30, 2005

(30) Foreign Application Priority Data

Oct. 30, 2003 (JP) ............................. 2003-371182

(51) Int. Cl.
*H01L 21/336* (2006.01)
*H01L 21/8234* (2006.01)

(52) U.S. Cl. ...................... 438/197; 438/680; 438/785

(58) Field of Classification Search ............... 438/197, 438/680, 781, 785, 723, 724, 725, 759, 756, 438/757, 787, 788, 791, 792, 796, 798, 905, 438/913
See application file for complete search history.

(56) References Cited

U.S. PATENT DOCUMENTS

| | | | | |
|---|---|---|---|---|
| 6,277,436 B1 * | 8/2001 | Stauf et al. | ............... | 427/126.3 |
| 6,607,958 B1 * | 8/2003 | Suguro | ..................... | 438/287 |
| 6,784,508 B1 * | 8/2004 | Tsunashima et al. | ......... | 257/411 |
| 6,844,234 B1 * | 1/2005 | Eguchi et al. | ............... | 438/287 |
| 6,960,537 B1 * | 11/2005 | Shero et al. | ................. | 438/775 |

FOREIGN PATENT DOCUMENTS

| | | |
|---|---|---|
| JP | 63-236335 | 10/1988 |
| JP | 2002-167672 | 6/2002 |
| JP | 2002-246388 | 8/2002 |

* cited by examiner

*Primary Examiner*—David Nhu
(74) *Attorney, Agent, or Firm*—Smith, Gambrell & Russell, LLP

(57) ABSTRACT

In a decompressed atmosphere and a heating atmosphere, a vapor of a hafnium organic compound is reacted with, e.g., a disilane gas in a reacting vessel, so as to form a hafnium silicate film on a silicon film. By reacting a dichlorosilane gas with a dinitrogen oxide gas, a silicon oxide film as a barrier layer is laminated on the hafnium silicate film. A polysilicon film as a gate electrode is formed on the silicon oxide film.

6 Claims, 9 Drawing Sheets

METHOD OF MANUFACTURING SEMICONDUCTOR DEVICE, FILM-FORMING APPARATUS, AND STORAGE MEDIUM

BACKGROUND OF THE INVENTION

1. Field of the Invention

The present invention relates to a method of manufacturing a semiconductor device including an insulating film formed of a high dielectric constant film such as a gate oxide film of a MOSFET or a capacitive element of a memory cell; a film-forming apparatus; and a storage medium that stores therein a program for executing the method.

2. Background Art

A gate insulating film of a MOSFET has conventionally been formed of a silicon oxide ($SiO_2$) film. By reducing a thickness of a silicon oxide film, an operation speed thereof can be improved. However, since the silicon oxide film with a smaller film thickness causes an increase in leakage current, an improvement of the operation speed is limited. Thus, a hafnium compound film (specific inductive capacity: 10–30) and a zirconium compound film (specific inductive capacity: 10 to 25) have recently been widely considered as new gate insulating films in place of a silicon oxide film. Such films have a higher dielectric constant than that of a silicon oxide film. In addition, when a physical film thickness of the films is increased, an electrical film thickness can be made small, so that a gate leakage current of a transistor can be restrained.

Japanese Patent Laid-Open Publication No. 2002-246388 (claims 1 and 6, section 0030) discloses a method of forming a hafnium oxide film by, for example, a chemical vapor deposition (CVD) using a material such as Hf alcoxide and an oxidation gas such as oxygen.

However, when a hafnium compound film is used as a gate insulating film, a problem can occur in that a flat band voltage (Vfb) of the hafnium compound film positioned below a gate electrode formed of polysilicon may shift several hundred mV (on the basis of an absolute value), as compared with a flat band voltage of a silicon oxide film being used as a gate insulating film.

The term flat band voltage is briefly described below. The flat band voltage (Vfb) is determined by a difference between a work function of an electrode and that of a substrate, and an electric charge in an insulating film. The flat band voltage can be expressed by the following equation (1).

$$Vfb = \Phi m - \Phi s - Q_{ox}/C_{ox} \quad (1)$$

In the equation (1), $\Phi m$ is a work function of an electrode, $\Phi s$ is a work function of a substrate, $Q_{ox}$ is an electric charge in an insulating film, and $C_{ox}$ is a capacity per unit area of the film.

As described above, when a hafnium compound film is used as a gate insulating film in place of a silicon oxide film, a flat band voltage of the hafnium compound film may shift several hundred mV. A reason therefor may be that a work function of a polysilicon electrode changes on account of hafnium (Hf) interposed between the polysilicon film and the hafnium compound film. Such a phenomenon may also occur in a case where a zirconium compound film is used as a gate insulating film.

SUMMARY OF THE INVENTION

The present invention is made in view of the above disadvantages. An object of the present invention is to provide a method of manufacturing a semiconductor device, a film-forming apparatus, and a storage medium that includes therein a program for executing the method. In the method according to the present invention, a barrier film such as a silicon oxide film is formed on a gate insulating film formed of a hafnium compound film or a zirconium compound film. Thus, a flat band voltage can be obtained, which is substantially equivalent to a flat band voltage when a silicon oxide film is used as a gate insulating film.

The present invention is a method of manufacturing a semiconductor device by forming an insulating film on a substrate, and forming on the insulating film an electrode for applying a voltage to the insulating film, the method comprising: a first step of reacting a source gas to form on the substrate an insulating film formed of a hafnium compound film; and a second step of forming on the insulating film a barrier film formed of a silicon oxide film or a silicon nitride film for preventing a diffusion of hafnium.

When both the silicon oxide film and the silicon nitride film are used as the barrier layer, one of the silicon oxide film or the silicon nitride film serves as the barrier layer. Thus, such a barrier layer is included in a technical scope of the present invention.

In the method of manufacturing a semiconductor device, the method may further comprise a third step of reacting a silane gas to form on the barrier film a polysilicon film as an electrode.

In the method of manufacturing a semiconductor device, the second step may be a step of reacting a silane gas and a dinitrogen oxide gas to form the silicon oxide film.

In the method of manufacturing a semiconductor device, the first step may be a step of reacting a hafnium organic compound and a silane gas to form a hafnium silicate film on the substrate.

In the method of manufacturing a semiconductor device, after the first step, the hafnium compound film may be annealed in a heating atmosphere by an ammonia gas. Alternatively, after the first step, the hafnium compound film may be annealed in a heating atmosphere by an oxygen gas or an ozone gas.

The present invention is a method of manufacturing a semiconductor device by forming an insulating film on a substrate, and forming on the insulating film an electrode for applying a voltage to the insulating film, the method comprising: a first step of reacting a source gas to form on the substrate an insulating film formed of a zirconium compound film; and a second step of forming on the insulating film a barrier film formed of a silicon oxide film or a silicon nitride film.

The present invention is a film-forming apparatus for manufacturing a semiconductor device by forming an insulating film on a substrate, and forming on the insulating film an electrode for applying a voltage to the insulating film, the apparatus comprising: a reaction vessel to which the substrate is loaded; heating means for heating a processing atmosphere in the reaction vessel; means for supplying a source gas for a hafnium compound film, that supplies into the reaction vessel a source gas for forming an insulating film formed of a hafnium compound film; means for supplying a source gas for a silicon oxide film, that supplies into the reaction vessel a source gas for forming a barrier film formed of a silicon oxide film for preventing a diffusion of hafnium; and means for controlling the respective means such that the insulating film and the barrier film are laminated on the substrate in that order.

In the film-forming apparatus, the apparatus may further comprise means for supplying a source gas for a polysilicon film, that supplies a source gas for reacting a silane gas to form a polysilicon film as an electrode. The apparatus may further comprise means for supplying a source gas for ammonia-annealing, that supplies into the reaction vessel an ammonia gas for annealing a hafnium compound film. The apparatus may further comprise means for supplying a source gas for ozone-annealing, that supplies into the reaction vessel an ozone gas for annealing a hafnium compound film.

The present invention is a film-forming apparatus for manufacturing a semiconductor device by forming an insulating film on a substrate, and forming on the insulating film an electrode for applying a voltage to the insulating film, the apparatus comprising: a reaction vessel to which the substrate is loaded; heating means for heating a processing atmosphere in the reaction vessel; means for supplying a source gas for a zirconium compound film, that supplies into the reaction vessel a source gas for forming an insulating film formed of a zirconium compound film; means for supplying a source gas for a silicon oxide film, that supplies into the reaction vessel a source gas for forming a barrier film formed of a silicon oxide film; and means for controlling the respective means such that the insulating film and the barrier film are laminated on the substrate in that order.

The present invention is a film-forming apparatus for manufacturing a semiconductor device by forming an insulating film on a substrate, and forming on the insulating film an electrode for applying a voltage to the insulating film, the apparatus comprising: a reaction vessel to which the substrate is loaded; heating means for heating a processing atmosphere in the reaction vessel; means for supplying a source gas for a hafnium compound film, that supplies into the reaction vessel a source gas for forming an insulating film formed of a hafnium compound film; means for supplying a source gas for a silicon nitride film, that supplies into the reaction vessel a source gas for forming a barrier film formed of a silicon nitride film; and means for controlling the respective means such that the insulating film and the barrier film are laminated on the substrate in that order.

A semiconductor device according to the present invention comprises: an insulating film formed on a substrate, the film being formed of a hafnium compound film or a zirconium compound film; a barrier film formed on the insulating film, the barrier film being formed of a silicon oxide film for preventing a diffusion of hafnium or zirconium; and an electrode formed on the barrier film for applying a voltage to the insulating film.

Another invention is a storage medium which stores therein a program for executing the method of manufacturing a semiconductor device according to the present invention. The program stored in the storage medium is installed in a computer as a control part of the film-forming apparatus according to the present invention. The film-forming apparatus is activated by this program to execute the above respective steps.

More specifically, in order that the insulating film and the barrier film are laminated on a substrate in that order, the program includes an instruction group for controlling the heating means, the means for supplying a source gas for a hafnium compound film, and the means for supplying a source gas for a silicon oxide film (or the means for supplying a source gas for a silicon nitride film) of the film-forming apparatus, so as to execute the first step of reacting a source gas to form on the substrate the insulating film formed of a hafnium compound film, and a second step of forming on the insulating film the barrier film formed of a silicon oxide film or a silicon nitride film for preventing a diffusion of hafnium.

When the method according to the present invention comprises, for example, the third step of reacting a silane gas to form on the barrier layer a polysilicon film as an electrode, the program executes such a step. In addition, when the method further comprises the step of annealing the hafnium compound film in a heating atmosphere by an ammonia gas after the first step, or the step of annealing the hafnium compound film in a heating atmosphere by an oxygen gas or an ozone gas after the first step, the program further executes such a step.

According to the present invention, since a barrier layer formed of a silicon oxide film or a silicon nitride film is interposed between a high dielectric film formed of a hafnium compound film or a zirconium compound film and a polysilicon electrode, a flat band voltage of a hafnium compound film or a zirconium compound film can be prevented from shifting, while maintaining a high dielectric constant feature thereof. That is, such a flat band voltage can be obtained that is substantially equivalent to a flat band voltage obtained when a silicon oxide film is used as an insulating film. As a result, there is no need for changing an existing circuit design, and thus a semiconductor device can be manufactured in accordance with the existing design.

DETAILED DESCRIPTION OF THE INVENTION

Figure 1:
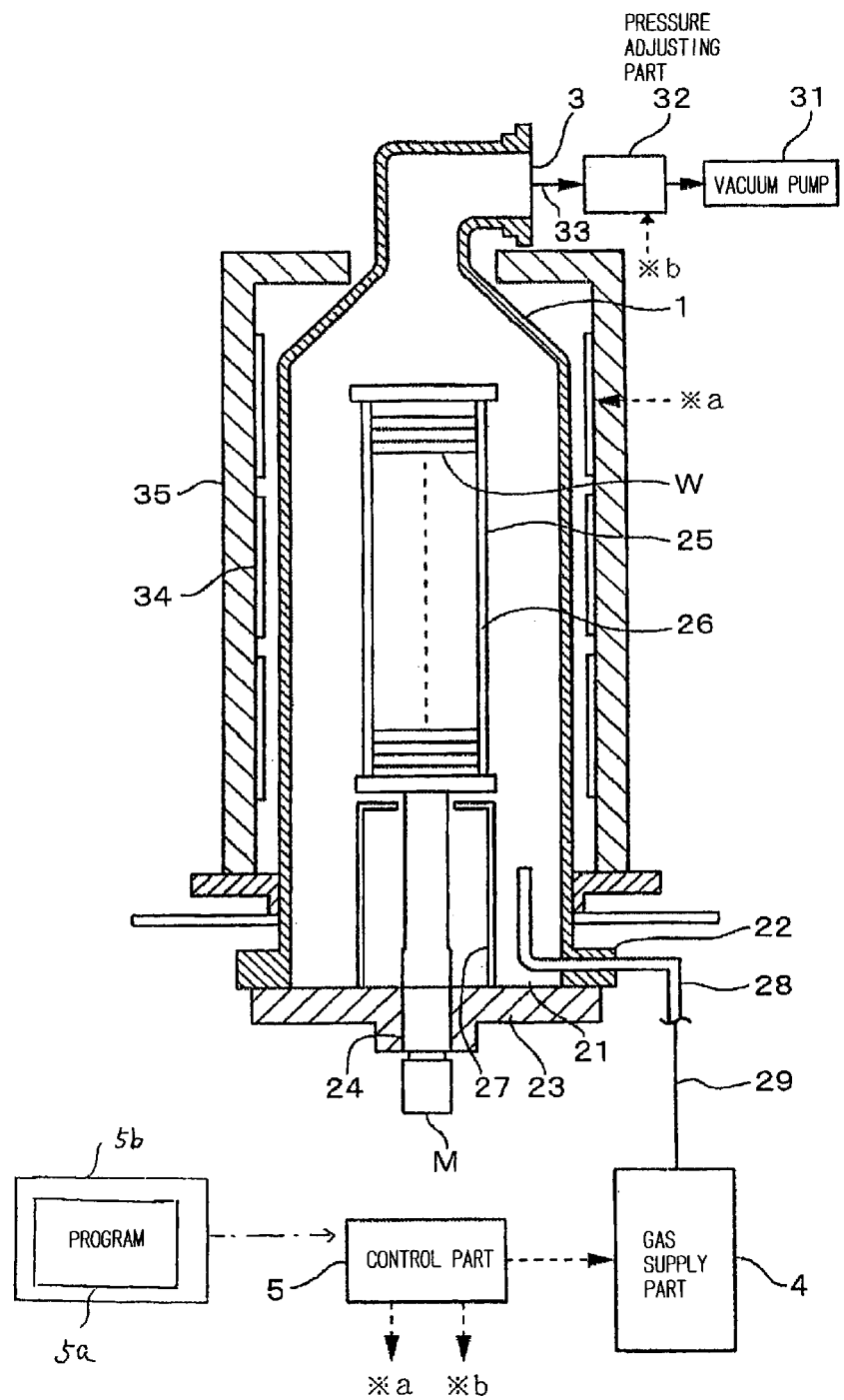
FIG. 1 is a longitudinal side view of a film-forming apparatus of an embodiment according to the present invention.

An embodiment of a film-forming method according to the present invention will be described below. First, a film-forming apparatus for realizing the film-forming method is described with reference to FIG. 1. FIG. 1 shows a vertical heat treatment system which is a low-pressure CVD apparatus of a batch type. In FIG. 1, the reference number 1 depicts a vertical cylindrically-shaped reaction vessel formed of quartz. A lower end of the reaction vessel 1 is opened to form an opening 21 as a throat. A flange 22 is integrally formed with the opening 21. A cover 23 formed of, e.g., quartz is disposed below the reaction vessel 1 to open and close the reaction vessel 1 by a vertical movement of a boat elevator (not shown). The opening 21 is air-tightly sealed by the cover 23 which comes into contact with a lower surface of the flange 22. A rotary shaft 24 passes through a center part of the cover 23. On an upper end of the rotary shaft 24, a wafer boat 25 for holding a substrate is mounted.

The wafer boat 25 has more than two, e.g., four struts 26 in which slots are formed such that a plurality of, for example, 125 pieces of objects to be processed, that is, semiconductor wafers (hereinafter referred to as "wafer") W are held thereon in a tier-like manner. Note that in an area where the 125 pieces of wafers W are held, a plurality of dummy wafers are held on upper and lower ends of the area, and product wafers are held between the upper and lower dummy wafers. A motor M as a driving part for rotating the rotary shaft 24 is disposed on a lower part of the rotary shaft 24, so that the wafer boat 25 is rotated by the motor M. A thermal insulation unit 27 is disposed on the cover 23 to surround the rotary shaft 24.

An L-shaped injector 28 is inserted in the flange 22 disposed on a lower part of the reaction vessel 1. The injector 28 supplies a gas to the wafers W contained in the reaction vessel 1. A gas supply pipe 29 as a gas supply passage is connected to a proximal end of the injector 28. A gas supply part 4 is disposed on a side of the proximal end of the injector 28 through the gas supply pipe 29. Thus, a gas required for forming a film can be supplied from the gas supply part 4 to the reaction vessel 1.

An exhaust port 3 for exhausting the reaction vessel 1 is formed on an upper part of the reaction vessel 1. An exhaust pipe 33 having a vacuum pump 31 and a pressure adjusting part 32 is connected to the exhaust port 3. The vacuum pump 31 and the pressure adjusting part 32 can discharge air in the reaction vessel 1 to reduce a pressure therein to a desired degree of vacuum. Around the reaction vessel 1, there is disposed a heating furnace 35 having a heater 34 as heating means for heating the reaction vessel 1. The heater 34 is preferably formed of a carbon wire having an excellent heat-up and heat-down feature without contamination.

The low-pressure CVD system further has a control part 5 formed of a computer. The control part 5 has a function of activating a program 5a to read a description of a process recipe in a memory (not shown), and controlling treatment conditions based on the recipe. The control part 5 outputs control signals for respectively controlling the heater 34, the pressure adjusting part 32, and the gas supply part 4. In addition to an instruction group for executing steps which will be described in a below description about an operation of a film-forming apparatus, the program 5a includes a program for displaying the process recipe on a screen to input parameters, for example. The program 5a stored in, e.g., a storage medium 5b is installed therefrom to the control part 5 so as to control the respective parts of the film-forming apparatus to execute the respective steps of the embodiment. The storage medium 5b may be a flexible disk, a compact disk, an MO (Magnet Optical) disk, a memory card, and so on.

Figure 2:
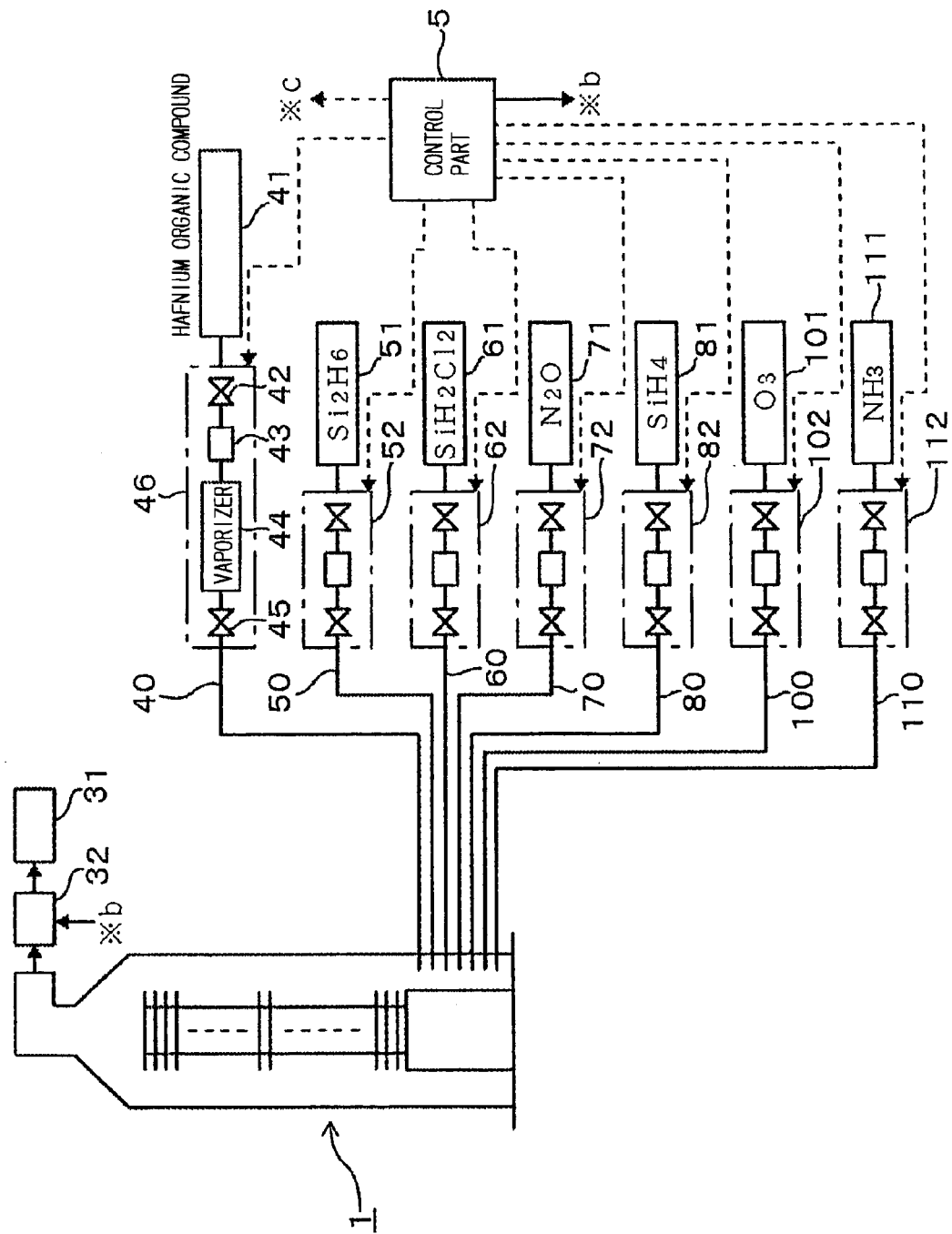
FIG. 2 is a structural view illustrating a gas supply part and a control part of the film-forming apparatus of the embodiment according to the present invention.
Figure 3:
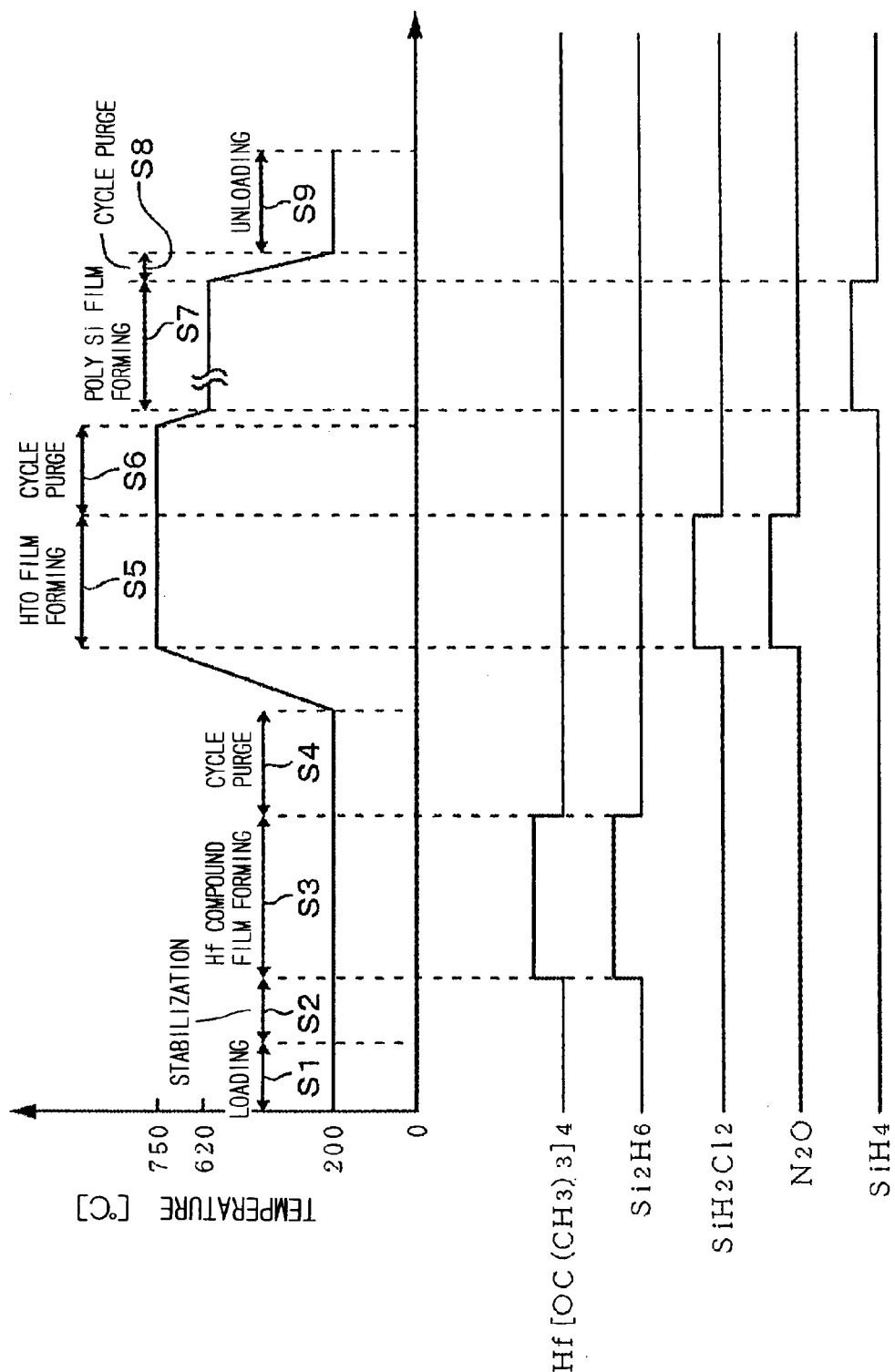
FIG. 3 is an illustrational view showing a film-forming process by the film-forming apparatus of the embodiment according to the present invention.

FIG. 2 is a structural view illustrating in detail the gas supply pipe 29 connected to the injector 28, the gas supply part 4, and the control part 5. A first gas supply pipe 40, a second gas supply pipe 50, a third gas supply pipe 60, a fourth gas supply pipe 70, a fifth gas supply pipe 80, a sixth gas supply pipe 100, and a seventh gas supply pipe 110 are connected to the injector 28. In FIG. 1, these gas supply pipes are represented by a single gas supply pipe to which a reference number 29 is allocated.

The first gas supply pipe 40 includes a supply source 41 of a hafnium organic compound such as tetra-tertiary-butoxy hafnium ($Hf[OC(CH_3)_3]_4$), and a gas supply instrument group 46, in that order from an upstream. The gas supply instrument group 46 has a valve 42, a liquid mass flow controller 43, a vaporizer 44, and a valve 45 in that order from the upstream. The supply source 41 of a hafnium organic compound is configured such that a liquid source as a hafnium organic compound is extruded therefrom. The second gas supply pipe 50 includes a supply source 51 of a silane gas such as disilane ($Si_2H_6$) gas, and a gas supply instrument group 52, in that order from the upstream. The gas supply pipes 40 and 50, the gas supply instrument groups 46 and 52, and the supply sources 41 and 51 constitute means for supplying a source gas for a hafnium compound film to form a hafnium compound film (in this example, hafnium silicate (HfSiO) film).

The third gas supply pipe 60 includes a supply source 61 of a silane gas such as a dichlorosilane ($SiH_2C_{12}$) gas, and a gas supply instrument group 62, in that order from the upstream. The fourth gas supply pipe 70 includes a supply source 71 of a nitride or oxide compound gas such as a dinitrogen oxide ($N_2O$) gas, and a gas supply instrument group 72 in that order from the upstream. The gas supply pipes 60 and 70, the gas supply instrument groups 62 and 72, and the supply sources 61 and 71 constitute means for supplying a source gas for a silicon oxide film to form a silicon oxide ($SiO_2$) film.

The fifth gas supply pipe 80 includes a supply source 81 of a silane gas such as a monosilane ($SiH_4$) gas, and a gas supply instrument group 82, in that order from the upstream. The gas supply pipe 80, the gas supply instrument group 82, and the supply source 81 constitute means for supplying a source gas for polysilicon oxide film to form a polysilicon film.

The sixth gas supply pipe 100 includes a supply source 101 of an ozone ($O_3$) gas, and a gas supply instrument group 102 in that order from the upstream. The gas supply pipe 100, the gas supply instrument group 102, and the supply source 101 constitute means for supplying a source gas for removing contaminants (organic matters) from a hafnium silicate film. The ozone gas supply source may supply only an ozone gas, but may supply a mixed gas of ozone and oxygen.

The seventh gas supply pipe 110 includes a supply source 111 of a nitride or hydrogen compound gas such as an ammonia ($NH_3$) gas, and a gas supply instrument group 112, in that order from the upstream. The gas supply pipe 110, the gas supply instrument group 112, and the supply source 111 constitute means for supplying a source gas for annealing a hafnium silicate film. The gas supply instrument groups 52, 62, 72, 82, 102, and 112 respectively have valves, mass flaw controllers as flow rate adjusting parts, and so on.

Not limited to a monosilane gas, the silane gas may be a disilane ($Si_2H_6$) gas, a dichlorosilane ($SiH_2C_{12}$) gas, a tetra-chlorosilane ($SiC_{14}$) gas, a hexa-chlorosilane ($Si_2C_{16}$) gas, a hexa-ethyl-amino-disilane gas, hexa-methyl-disilazane gas, a disilylanine gas, a trisilylamine gas, bis-tertiary-butyl amino-silane gas, and so on.

Figure 4A:
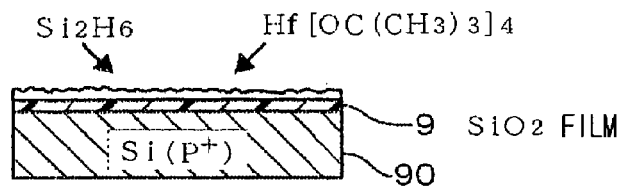
FIGS. 4(*a*) to 4(*f*) are illustrational views showing a film formed by the film-forming process according to the present invention.

An example of a film-forming method carried out by using the above low-pressure CVD system is described below with reference to FIGS. 1 to 4. First, a semiconductor wafer (hereinafter referred to as "wafer") W as a substrate is prepared. As shown in FIG. 4(a), the wafer W has a silicon film 90 of P-type formed on its surface, and a silicon oxide film 9 formed on the silicon film 90. Then, the predetermined number of wafers W are held in the wafer boat 25 in a tier-like manner. By elevating the boat elevator (not shown), the wafers boat 25 holding the wafers W therein is loaded to the reaction vessel 1 (the condition is shown in FIG. 1) (S1). After the wafer boat 25 is loaded to the reaction vessel 1 and the lower opening of the injector 28 is sealed by the cover 23, a temperature in the reaction vessel 1 is stabilized to be a process temperature in a range of, e.g., from 200 to 300° C. Thereafter, the reaction vessel 1 is vacuum-pumped to a desired degree of vacuum by the vacuum pump 31 through the exhaust port 3 (S2).

After the process temperature in the reaction vessel 1 is stabilized, tetra-tertiary-butoxy hafnium in a liquid state is discharged from the supply source 41 of a hafnium organic compound, with a feed rate thereof being adjusted to be 0.02 to 1 sccm by the liquid mass flaw controller 43. The liquid tetra-tertiary-butoxy hafnium is evaporated by the vaporizer 44, and the vapor is supplied to the reaction vessel 1 through the first gas supply pipe 40. A disilane gas is supplied from the second gas supply pipe 50 to the reaction vessel 1, with a feed rate thereof being adjusted to be 50 to 1000 sccm. A pressure in the reaction vessel 1 is adjusted to a decompressed atmosphere of, e.g., 26.6 to 133 Pa (0.2 to 1.0 Torr) by the pressure adjusting part 32.

Figure 4B:
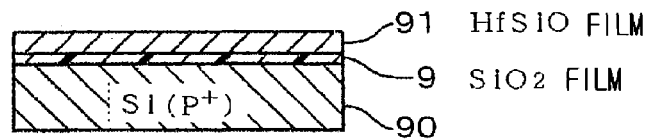

As shown in FIG. 4(a), the tetra-tertiary-butoxy hafnium and the disilane gas are thermally decomposed to react with each other in the reaction vessel 1. Then, as shown in FIG. 4(b), a hafnium silicate film 91 as a gate insulating film including hafnium, oxygen, and silicon is formed on a surface of the silicon oxide film 9 of the wafer W (S3). Then, in order to discharge a gas remaining in the reaction vessel 1, a cycle purge is carried out (S4). The cycle purge includes a step of full-opening the pressure adjusting part 32, and a step of purging the reaction vessel 1 by an $N_2$ gas. The steps are alternately repeated during the cycle purge.

Figure 4C:
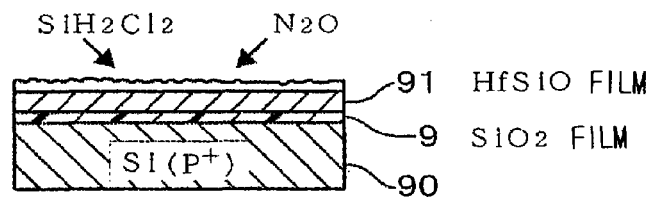
Figure 4D:
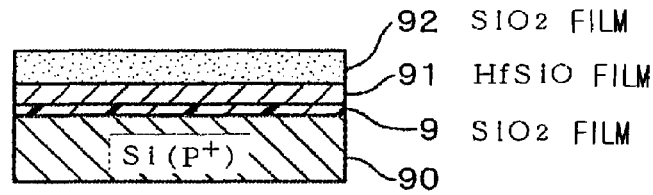

Next, the temperature of the reaction vessel 1 is raised to, for example, 750° C. Then, a dichlorosilane gas is supplied from the third gas supply pipe 60 to the reaction vessel 1 with a feed rate thereof being adjusted to be a predetermined rate. At the same time, a dinitrogen oxide gas is supplied from the fourth gas supply pipe 70 to the reaction vessel 1 with a feed rate thereof being adjusted to be a predetermined rate. The pressure in the reaction vessel 1 is adjusted to be a decompression atmosphere of, e.g., 53.2 Pa (0.4 Torr) by the pressure adjusting part 32. As shown in FIG. 4(c), the dichlorosilane gas and the dinitrogen oxide gas are thermally decomposed to react with each other in the reaction vessel 1. Then, as shown in FIG. 4(d), a silicon oxide film 92 is formed on the hafnium silicate film 91 (S5). After the silicon oxide film 92 as a barrier film with a predetermined thickness is formed on the hafnium silicate film 91, a cycle purge similar to the above is carried out (S6), so as to discharge the gas remaining in the reaction vessel 1.

Figure 4E:
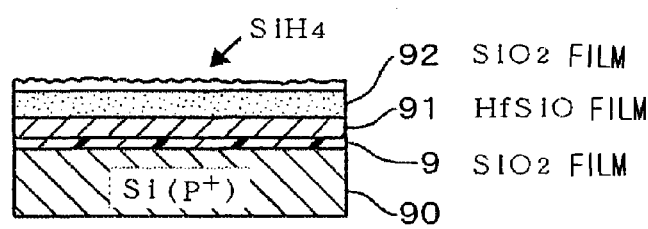
Figure 4F:
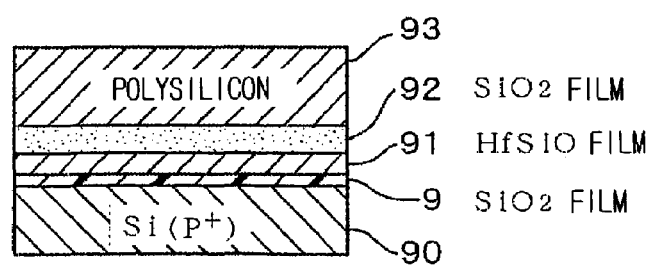

Thereafter, the temperature in the reaction vessel 1 is lowered to a process temperature in a range about 620° C., for example. A monosilane gas is supplied from the fifth gas supply pipe 80 to the reaction vessel 1, with a feed rate thereof being adjusted to be a predetermined feed rate. Then, the pressure in the reaction vessel 1 is adjusted to be a decompressed atmosphere of e.g., 26.6 Pa (0.2 Torr) by the pressure adjusting part 32. As shown in FIG. 4(e), the monosilane gas is thermally decomposed to react in the pressure vessel 1. Then, as shown in FIG. 4(f), a polysilicon film 93 is formed on the silicon oxide film 92 (S7). During the above series of steps (continuous film-forming process), the wafer boat 25 is rotated by the motor M. After the polysilicon film 93 with a predetermined thickness is formed on the silicon oxide film 92, the above-described cycle purge is carried out to discharge the gas remaining in the reaction vessel 1. Then, the temperature in the reaction vessel 1 is lowered to a temperature in a range of, e.g., from 200 to 400° C. (S8). Finally, the wafer boat 25 is unloaded from the reaction vessel 1 (S9).

The above series of steps are executed by the control part 5 which reads out the program 5a and sends control signals to the respective parts. The above steps S1 to S9 correspond to the steps constituting a method of manufacturing a semiconductor device of the embodiment. The program 5a includes an instruction group for controlling the heater 34, the pressure adjusting part 32, the gas supply instrument groups 46, 52, 62, 72, and 82, in order to sequentially execute the above steps S2 to S9 after the wafers W are loaded in the reaction vessel 1. That is, the program 5a reads values of parameters written in the process receipt set in the input screen, and controls the heater 34, the pressure adjusting part 32, the gas supply instrument groups 46, 52, 62, 72, and 82, in order to obtain the parameter values. The program 5a herein is a program which is activated after the wafers W are loaded in the reaction vessel 1. However, the program according to the present invention may include instructions relating to operations which are carried out before the wafers W are loaded in the reaction vessel 1.

Figure 5:
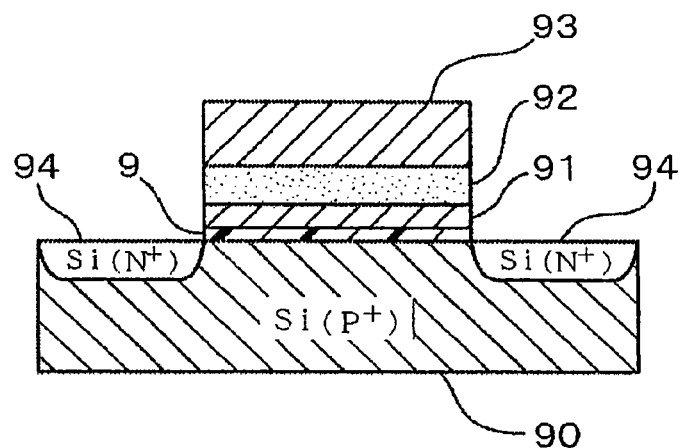
FIG. 5 is an illustrational view showing a step succeeding the film-forming process according to the present invention.

Impurity elements such as phosphorus (P) or boron (B) are injected to the polysilicon film 93 of the unloaded wafer W by an ion injection, so that a gate electrode is formed. After etching both sides of an electrode structure which is formed of the hafnium silicate film 91, the silicon oxide film 92, and the polysilicon film 93, impurity elements such as phosphorus (P) or boron (B) are injected to the silicon film 90. Then, as shown in FIG. 5, an impurity diffusion layer 94 is formed on the silicon film 90. Thereafter, a source electrode and a drain electrode are formed on the impurity diffusion layer 94, so that a MOSFET is manufactured.

In the above embodiment, the silicon oxide film 9 (thermal oxide film) on the silicon substrate is formed by an apparatus different from the apparatus shown in FIG. 1. However, the apparatus shown in FIG. 1 may have means for forming a thermal oxide film, such as an oxygen gas supply source and a vapor supply source. The apparatus may also have gas supply pipes through which an oxygen gas and a vapor from the supply sources are supplied to the reaction vessel 1, and gas supply instrument groups disposed on the gas supply pipes. The control part 5 controls the respective gas supply instrument groups, and thus the silicon oxide film 9 can be formed by the apparatus shown in FIG. 1.

When a gate electrode structure is manufactured in accordance with the above embodiment, lowering of a flat band shift ($\Delta Vfb$) can be restrained, as compared with a gate electrode structure in which the polysilicon film 93 as a gate electrode is directly laminated on the hafnium silicate film 91, which will be clearly seen from the experiments below. In addition, a value of flat band voltage of the gate electrode structure can be approximate to, or substantially equal to a value which is obtained when a silicon oxide film is used as a gate insulating film. The reason may be considered as follows. When the polysilicon film 93 is directly formed on the hafnium silicate film 91, the hafnium silicate film 91 and the polysilicon film 93 are reacted with each other at an interface thereof to generate a reactant which causes an increase in the flat band shift. Thus, it is supposed that the silicon oxide film 92 interposed between the films 91 and 93 serves as a barrier layer which prevents the films 91 and 93 from reacting with each other.

Figure 6:
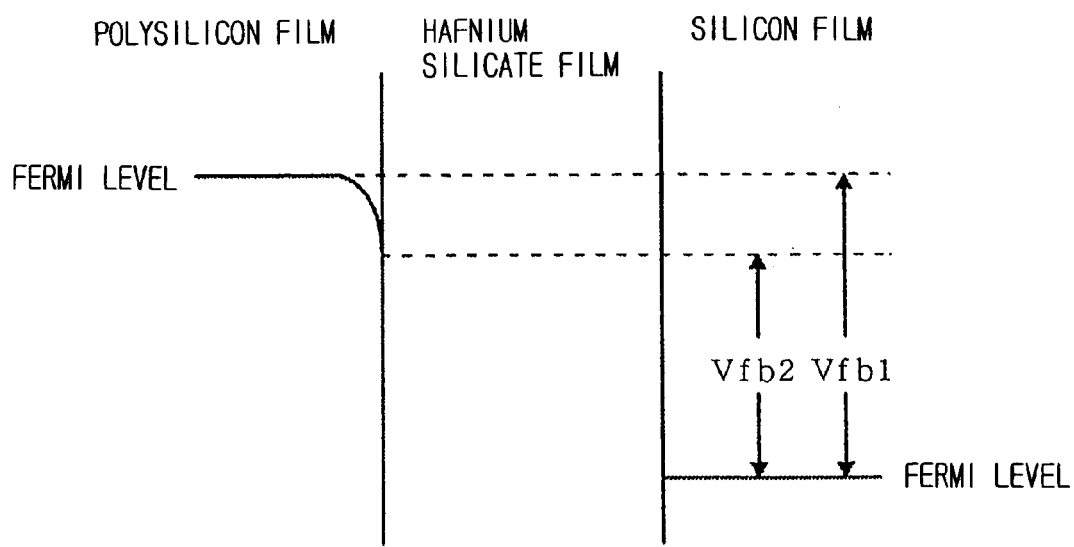
FIG. 6 is an image view showing a Fermi level and a flat band voltage.

FIG. 6 is an image view showing a Fermi level and a flat band voltage. When the polysilicon film 90 is directly formed on the hafnium silicate film 91, a Fermi level of a surface of the polysilicon film 93 on a side of the hafnium silicate film 91 is dropped, so that a difference between Fermi levels of the surfaces of the hafnium silicate film 91 is decreased from Vfb1 to Vfb2. Thus, a flat band voltage (Vfb) is reduced. An interposition of the silicon oxide film 92 between the polysilicon film 93 and the hafnium silicate film 91 prevents the Fermi level of the polysilicon film 93 from being dropped. In consequence, it is supposed that the flat band voltage (Vfb) close to an ideal value can be obtained.

When the hafnium silicate film 91, the silicon oxide film 92, and the polysilicon film 93 are continuously formed to manufacture a layered body by the common film-forming apparatus, an increased throughput can be obtained. However, the respective films 91, 92, and 93 may be formed by different film-forming apparatuses, or two layers of the three layers (91, 92, and 93) may be continuously formed by a common film-forming apparatus. Not limited to an ion injection, impurities such as phosphorus or boron may be doped in the polysilicon film 93 by supplying a phosphine ($PH_3$) gas or a diborane ($B_2H_6$) gas to a treatment area, so as to provide the polysilicon film 93 having impurities doped therein.

In place of the hafnium silicate film, a hafnium compound film may be an oxide hafnium ($HfO_2$) film. In this case, oxygen ($O_2$) or ozone ($O_3$) is used in place of a disilane gas. As shown in FIG. 2, for example, with a discharge of liquid tetra-tertiary-butoxy hafnium from the supply source 41 of a hafnium organic compound, an ozone gas is supplied to the reaction vessel 1 from the sixth gas supply pipe 100.

After the hafnium silicate film 91 or an oxide hafnium film is formed, as shown in FIG. 2, an ozone gas may be supplied into the reaction vessel 1 from the sixth gas supply pipe 100 in a predetermined heating atmosphere so as to anneal the hafnium silicate film 91 or the oxide hafnium film. When a hafnium compound film is annealed by an ozone gas (including a mixed gas of ozone and oxygen), impurities such as carbon in the hafnium compound film can be reduced, which results in excellent electric properties. To be specific, a shift amount of Vfb can be restrained, when a voltage stress is applied.

Before or after the annealing treatment, an ammonia gas may be supplied to the reaction vessel 1 from the gas supply pipe 110 in a predetermined heating atmosphere so as to anneal the hafnium silicate film 91 or the oxide hafnium film, and then the silicon oxide film 92 as a barrier layer may be formed. When a hafnium compound film is annealed by an ammonia gas, a crystallization temperature of the hafnium compound film can be raised, whereby a limitation in temperature is mitigated in the succeeding steps. In this embodiment, since a series of steps, i.e., from a step of forming a hafnium compound film to a step of forming a barrier layer, are continuously carried out in the same furnace, there is no fear of interposing a natural oxide film between surfaces of the respective films.

Not limited to tetra-tertiary-butoxy hafnium, a hafnium organic compound may be other hafnium alkoxide such as $Hf(OC_3H7)_4$ or TDEAH. Although an ammonia gas is taken as an example of a gas including nitrogen and hydrogen, for annealing the silicon film 90 and the hafnium silicate film 91, hydrazine ($N_2H_2$) may be used.

As shown in FIG. 2, in place of the silicon oxide film 92, a silicon nitride ($Si_3N_4$) film may be formed on the hafnium silicate film 91 by using an ammonia gas supplied from the gas supply pipe 110 and a dichlorosilane gas supplied from the gas supply pipe 60, and the polysilicon film 93 as a gate electrode may be formed on the silicon nitride film. Also in this case, as described above, a silicon nitride film may be formed after the hafnium silicate film 91 is annealed by an ammonia gas. Also in this manner, the same effect as above can be obtained.

Taking a hafnium compound by way of an example of a gate insulating film, the problem relating to an interface of the hafnium compound film and the silicon film has been described above. However, such a problem will also occur, when a zirconium (Zr) compound film such as a zirconium silicate (ZrSiO) film or an oxide zirconium ($ZrO_2$) film is used as a gate insulating film. Thus, the present invention can be applied when a gate insulating film is formed of a zirconium compound film. In this manufacturing method, an organic source of zirconium organic compound such as $Zr[OC(CH_3)_3]_4$ may be used as the gas supply source 41 shown in FIG. 2. The gas supply pipe 100 connected to the gas supply source 101 of oxygen and ozone may also be used.

The present invention is designed for a structure having a high dielectric constant film as an insulating film on which a polysilicon electrode for applying a voltage to the film is laminated. In the above embodiment, although a gate insulating film is taken for instance as an application of a high dielectric constant film, a high dielectric constant film obtained by the present invention may be a capacitive element used as a flash memory. Not limited to a batch type, a film forming apparatus may be a wafer-fed type.

EXAMPLES

Experiments which were carried out for demonstrating effects of the present invention will be described below.

(Formation of Gate Insulating Film)

A. Example 1

A hafnium silicate film as a gate insulating film was formed on a surface of a P-type silicon film on a wafer, by using a film-forming apparatus of the same kind as the above-described film-forming apparatus. Then, a CVD silicon oxide film as a barrier layer, and a polysilicon film as a gate electrode were formed in that order, by using the same film-forming apparatus. The thus formed layered body is referred to as Example 1. Process conditions for the respective films, and their film thicknesses were as follows:

[Process Conditions for Hafnium Silicate Film]
specified temperature: 200 to 300° C.
specified pressure: 0.3 to 0.5 Torr
specified flow rate of tetra-tertiary-butoxy hafnium: 0.1 to 0.3 sccm
specified flow rate of disilane gas: 200 to 400 sccm
film thickness: 25 Å

[Process Conditions for CVD Silicon Oxide Film]
specified temperature: 700 to 750° C.
specified pressure: 0.4 Torr
specified flow rate of dichlorosilane gas: 0.05 sccm
specified flow rate of dinitrogen oxide gas: 0.15 sccm
film thickness: 10 Å

[Process Conditions for Polysilicon Film]
specified temperature: 620° C.
specified pressure: 0.2 Torr
specified flow rate of monosilane gas: 250 sccm
film thickness: 1500 Å

B. Example 2

A hafnium silicate film, a CVD silicon oxide film, and a polysilicon films were formed on a silicon film in the same manner as that of Example 1. Then, the hafnium silicate film was annealed by an ammonia ($NH_3$) gas in a heating atmosphere of 600 to 800° C. The thus formed layered body is refereed to as Example 2.

C. Comparative Example 1

Four layered bodies in which film thicknesses were different from each other were formed in the same manner as that of Example 1, but a CVD silicon oxide film as a barrier layer was not formed. These layered bodies are collectively referred to as Comparative Example 1.

D. Reference 1

In place of a hafnium silicate film and a silicon oxide film as a barrier layer, a silicon thermal oxide film (which is formed by heating and oxidizing a surface of silicon) as a conventional gate insulating film was formed. Excluding this step, four layered bodies were formed in the same manner as that of Example 1. In the four layered bodies, thicknesses of the silicon thermal oxide films were different from each other. These layered bodies are collectively referred to as Reference 1.

E. Example 3

A hafnium silicate film as a gate insulating film was formed on a surface of an N-type silicon film on a wafer. Then, a silicon nitride film as a barrier layer, and a polysilicon film as a gate electrode were formed in that order, by means of the same film-forming apparatus. The thus formed layered body is referred to as Example 3. Process conditions for the hafnium silicate film and the polysilicon film were the same as those of Example 1. Process conditions for the silicon nitride layer were as follows.

[Process Conditions for Silicon Nitride Film]
specified temperature: 600 to 650° C.
specified pressure: 0.15 Torr
specified flow rate of dichlorosilane gas: 20 to 40 sccm
specified flow rate of ammonia gas: 100 to 150 sccm
film thickness: 3 to 10 Å

F. Comparative Example 2

A layered body was formed in the same manner as that of Example 3, but a silicon nitride film was not formed. The thus formed layered body is referred to as Comparative Example 2.

H. Reference 2

In place of a hafnium silicate film and a silicon nitride film as a barrier layer, a thermal oxide film as a conventional gate insulating film was formed. Excluding this step, a layered body was formed in the same manner as that of Example 3. The thus formed layered body is referred to as Reference 2.

(Measurement of Flat Band Voltage)

Flat band voltages of the respective layered bodies were measured by means of a standard CV measurement apparatus.

Figure 7:
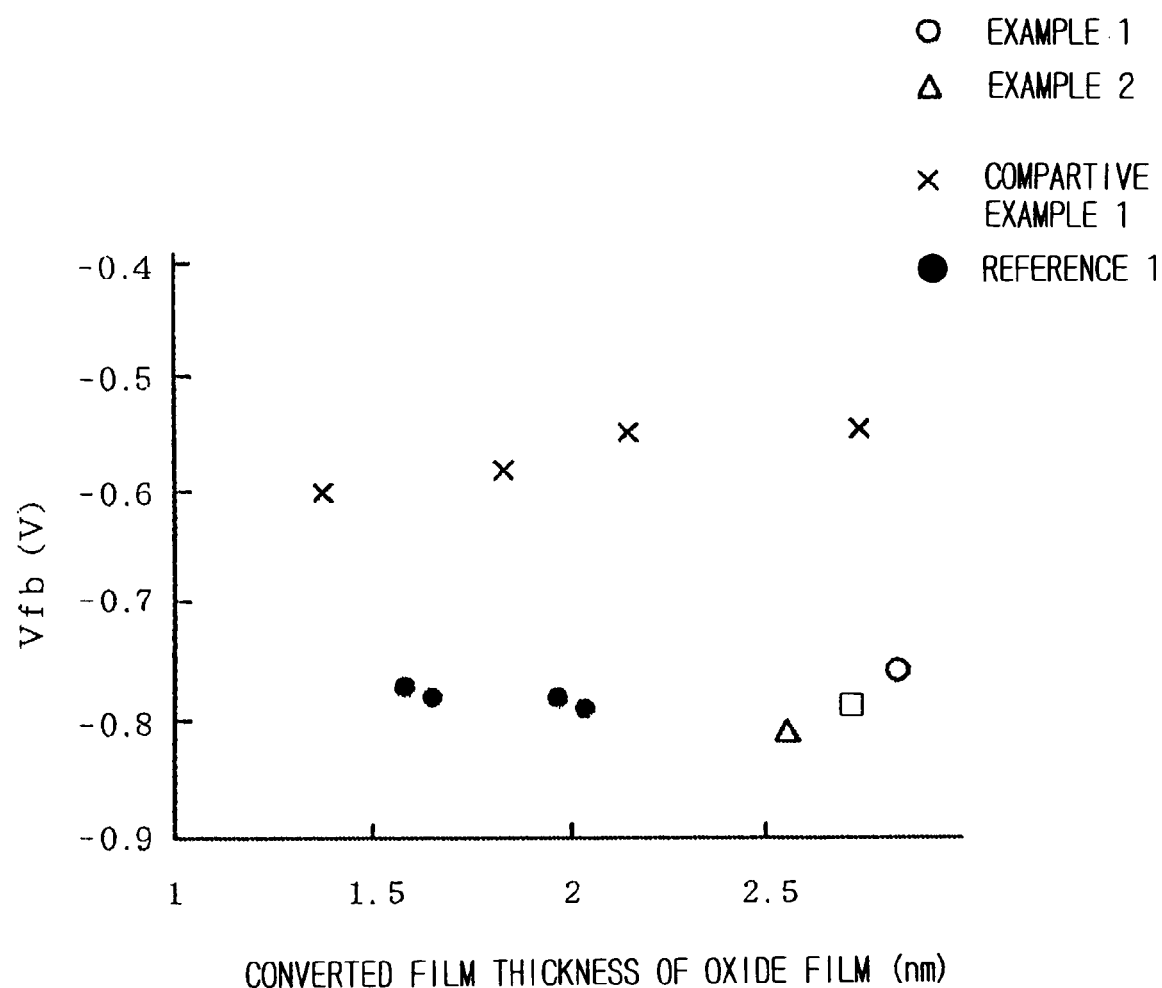
FIG. 7 is a view showing a relation of a flat band voltage and a converted film-thickness of an oxide film.

In FIG. 7, the vertical axis takes on a flat band voltage (Vfb), and the horizontal axis takes on a converted film thickness (nm) of an oxide film. The term "converted film thickness" of an oxide film means a film thickness of a silicon oxide film which is required for exhibiting the same capacity as that of an electron or positive hole exhibited by a gate insulating film with a certain film thickness. In FIG. 7, ○ represents Example 1, Δ represent Example 2, □ represents Example 3, × represents Comparative Example 1, and ● represents Reference 1. As can be seen from FIG. 7, the flat band voltage of Reference 1 is about 0.8V, which is not so different from the flat band voltages of Examples 1 to 3. On the other hand, the flat band voltage of Comparative Example 1 is as small as about −0.6V. Thus, it is understood that, by interposing a silicon oxide film between a hafnium compound film and a polysilicon film, a flat band voltage that is equivalent to a flat band voltage obtained when a silicon oxide film is used as an insulating film can be obtained.

Figure 8:
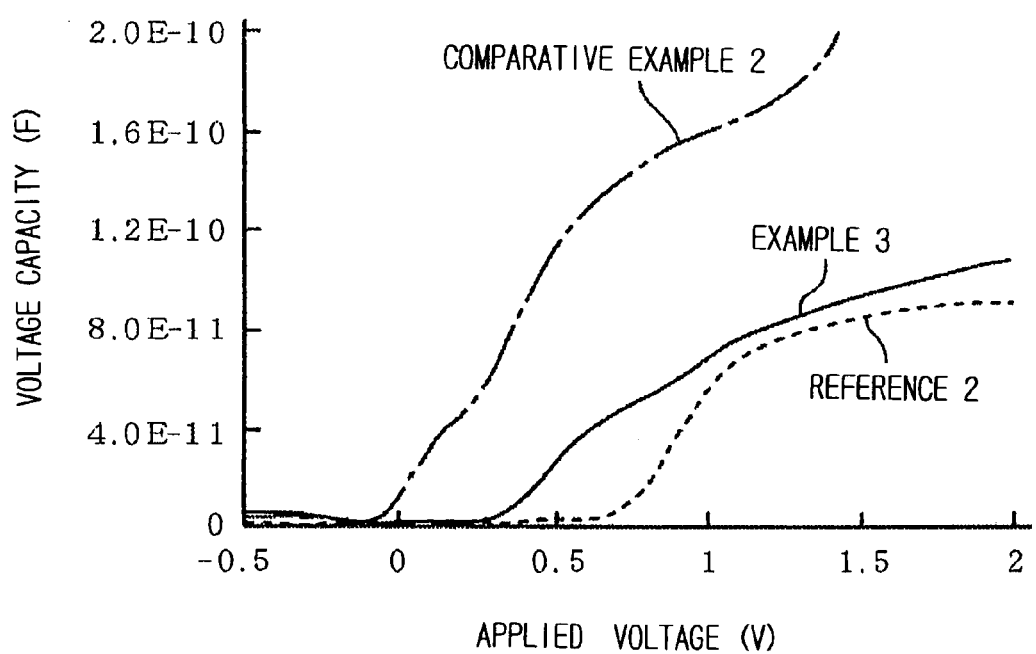
FIG. 8 is a view showing a relation of a voltage capacity and an applied voltage.

FIG. 8 is a graph showing a relation of a voltage applied between the silicon substrate and the polysilicon film, and a voltage capacity of each of the layered bodies. As can be seen from FIG. 8, a C-V curve of Example 3 in which a silicon nitride film is formed comes near a C-V curve of Reference 2 in which a conventional thermal oxide film is formed. Thus, it is demonstrated that, by using a silicon nitride film, a shift amount of the flat band voltage (Vfb) can be reduced.

(Experiment for Demonstrating Effects Produced from Annealing Treatment by Ozone Gas)

Figure 9:
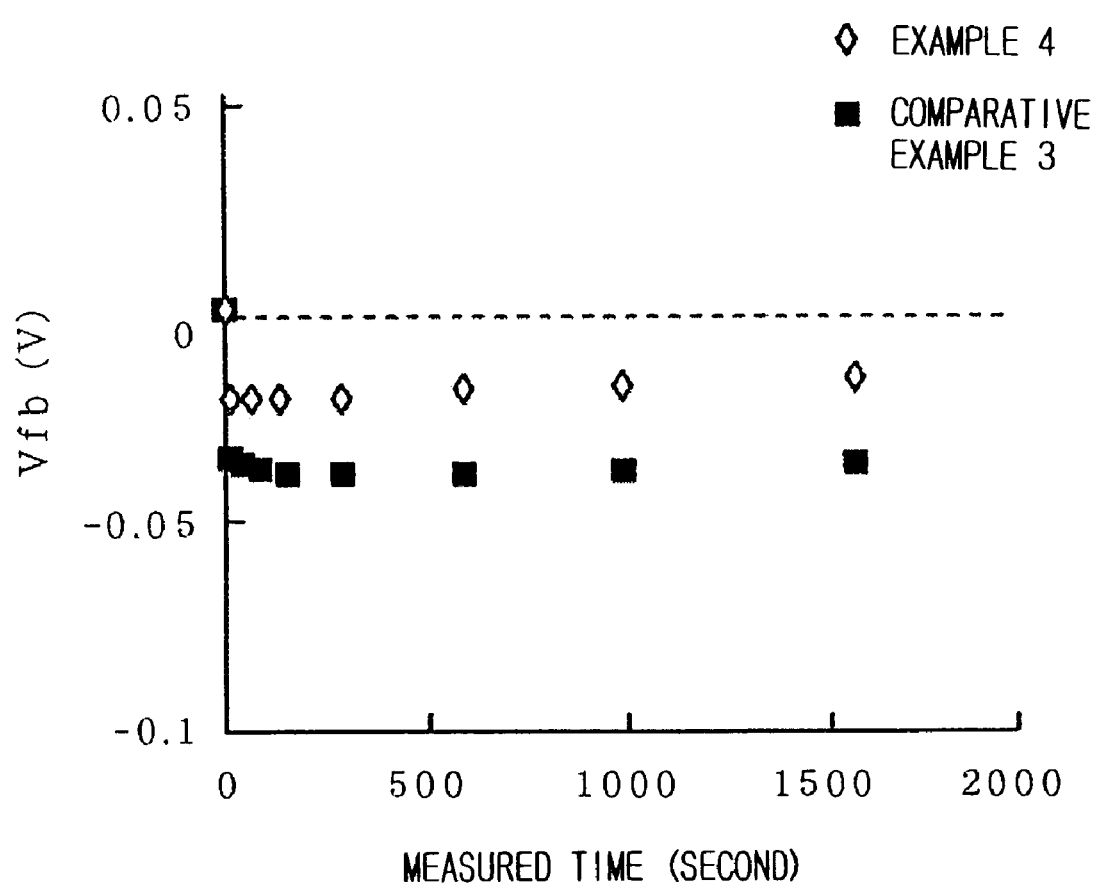
FIG. 9 is a view showing a relation of an annealing treatment of a surface of a hafnium silicate film and a Vfb shift amount thereof.

A substrate, on which a silicon oxide film having a film thickness of 1 nm was formed, was prepared. A hafnium silicate film was formed on the substrate in predetermined process conditions by using tetra-tertiary-butoxy hafnium and a disilane gas. The hafnium silicate film was annealed for three minutes by an ozone gas in a heating atmosphere of 250° C. Then, a constant voltage stress of −3V was applied to a gate electrode of the hafnium silicate film. Thereafter, a flat band voltage (Vfb) of the film was measured by means of a standard CV measuring apparatus to examine a Vfb shift amount with an elapse of time. FIG. 9 shows the result in which ◇ represents Example 4.

The same experiment was carried out with respect to a hafnium silicate film which was not annealed by an ozone gas. FIG. 9 shows the result in which ■ represents Comparative Example 2.

As can be seen from the result shown in FIG. 9, a Vfb shift amount of the hafnium silicate film, which was annealed by an ozone gas, is smaller than a Vfb shift amount of the hafnium silicate film which was not annealed. Thus, it is understood that, by annealing a hafnium silicate film by an ozone gas, a charge trapping property (Vfb shift caused by a negative bias stress) of the hafnium silicate film can be improved. The same experiment was carried out with respect to a hafnium silicate film which was annealed by an oxygen gas. A Vfb shift amount thereof was substantially the same as that of the hafnium silicate film which was not annealed.

(Experiment for Demonstrating Effects Produced from Annealing Treatment by Ammonia Gas)

Hafnium silicate films were formed on substrates in predetermined process conditions by using tetra-tertiarybutoxy hafnium and a disilane gas. The hafnium silicate films were annealed by an ammonia gas. The annealing conditions were designed such that an annealing temperature was 800° C., a pressure was $2.66 \times 10^2$ Pa (2 Torr), a flow rate of an ammonia gas was 2 slm, and an annealing period was thirty minutes.

Figure 10A:
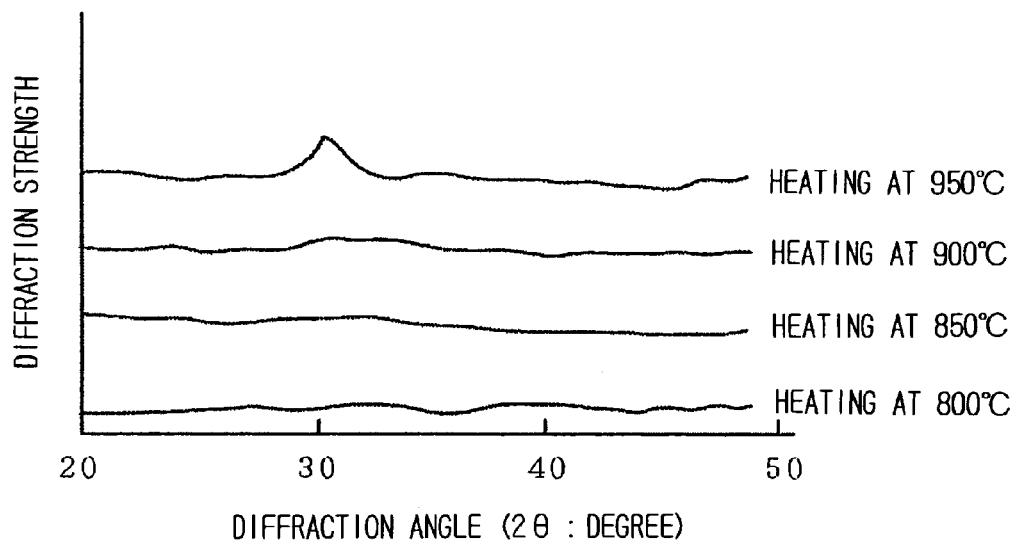
FIGS. 10(*a*) and 10(*b*) are views showing a relation of a heating temperature and a presence of crystallization of a substrate surface.

In order to examine at which temperature the obtained substrates crystallize, the substrates were separated into four groups. The substrates separated into four groups were heated for one minute in an inert atmosphere at temperatures of 800° C., 850° C., 900° C., and 950° C., respectively. Then, a presence of crystallization of the hafnium silicate film of each of the annealed substrates was examined by means of an X-ray diffraction analysis, a result of which is shown in FIG. 10(a). As can be seen from FIG. 10(a), the substrate heated at the temperature of 950° C. shows a peak, while the substrate heated at the temperature of 900° C. has no peak. Thus, it is understood that the hafnium silicate film which is obtained in the above-described manner does not crystallize at the temperature of 900° C.

Figure 10B:
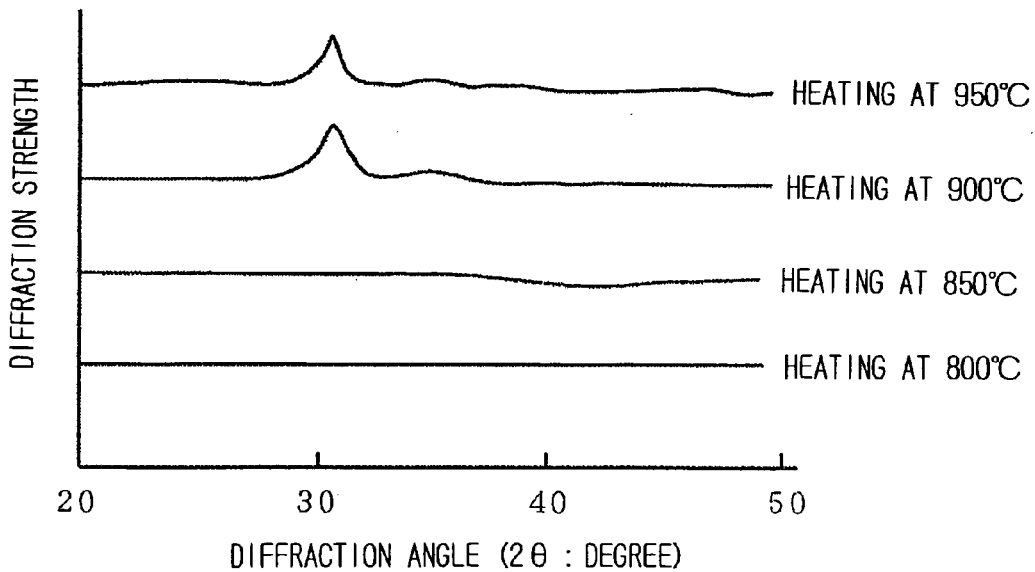

Hafnium silicate films were formed on substrates in the same manner as described above, but the films were not annealed by an ammonia gas. Similarly, a presence of crystallization of each of the hafnium silicate films was examined by means of an X-ray diffraction analysis, a result of which is shown in FIG. 10(b). As can be seen from FIG. 10(b), the substrate heated at the temperature of 900° C. shows a peak, indicating that the hafnium silicate film crystallizes at 900° C. As a result, it is understood that, by annealing a hafnium silicate film by an ammonia gas, the hafnium silicate film crystallizes at a higher temperature.

The invention claimed is:

1. A method of manufacturing a semiconductor device by forming an insulating film on a substrate, and forming on the insulating film an electrode for applying a voltage to the insulating film, the method comprising: a first step of reacting a source gas to form on the substrate an insulating film formed of a hafnium compound film; and a second step of forming on the insulating film a barrier film formed of a silicon oxide film or a silicon nitride film for preventing a diffusion of hafnium.

2. The method of manufacturing a semiconductor device according to claim 1, further comprising: a third step of reacting a silane gas to form on the barrier film a polysilicon film as an electrode.

3. The method of manufacturing a semiconductor device according to claim 1, wherein the second step is a step of reacting a silane gas and a dinitrogen oxide gas to form the silicon oxide film.

4. The method of manufacturing a semiconductor device according to claim 1, wherein the first step is a step of reacting a hafnium organic compound and a silane gas to form a hafnium silicate film on the substrate.

5. The method of manufacturing a semiconductor device according to any one of claims 1 to 4, wherein after the first step, the hafnium compound film is annealed in a heating atmosphere by an ammonia gas.

6. The method of manufacturing a semiconductor device according to claim 1, wherein after the first step, the hafnium compound film is annealed in a heating atmosphere by an oxygen gas or an ozone gas.

* * * * *